United States Patent
Sander et al.

(10) Patent No.: US 7,158,494 B2
(45) Date of Patent: Jan. 2, 2007

(54) MULTI-MODE COMMUNICATIONS TRANSMITTER

(75) Inventors: Brian Sander, San Jose, CA (US);
Wendell B. Sander, Los Gatos, CA (US); Stephan V. Schell, San Francisco, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 736 days.

(21) Appl. No.: 10/045,199

(22) Filed: Oct. 22, 2001

(65) Prior Publication Data
US 2004/0208157 A1   Oct. 21, 2004

(51) Int. Cl.
*H04Q 7/00* (2006.01)
*H04L 23/02* (2006.01)

(52) U.S. Cl. .............. 370/329; 370/335; 370/503; 375/261

(58) Field of Classification Search .......... 370/328, 370/330, 329, 335, 345, 348, 503; 375/261
See application file for complete search history.

(56) References Cited

U.S. PATENT DOCUMENTS

| | | | |
|---|---|---|---|
| 5,745,527 A | 4/1998 | Kelton et al. | 375/308 |
| 5,903,546 A * | 5/1999 | Ikeda et al. | 370/232 |
| 6,185,259 B1 | 2/2001 | Dent | 375/261 |
| 6,393,064 B1 * | 5/2002 | Nagai et al. | 375/259 |
| 6,473,467 B1 * | 10/2002 | Wallace et al. | 375/267 |
| 2001/0053142 A1 * | 12/2001 | Abe et al. | 370/337 |
| 2002/0122406 A1 * | 9/2002 | Chillariga et al. | 370/347 |
| 2002/0154705 A1 * | 10/2002 | Walton et al. | 375/267 |

FOREIGN PATENT DOCUMENTS

| | | |
|---|---|---|
| EP | 0 800 267 | 10/1997 |
| EP | 0 800 267 A2 | 10/1997 |
| EP | 0 895 363 | 2/1999 |
| EP | 0 895 363 A2 | 2/1999 |
| WO | 01/26219 | 4/2001 |
| WO | 01/26219 A1 | 4/2001 |
| WO | 02/084897 | 10/2002 |
| WO | 02/084897 A2 | 10/2002 |

OTHER PUBLICATIONS

Matsuoka et al., "Adaptive Modulation System with Variable Coding Rate Concatenated Code for High Quality Multi-Media Communications Systems", 1996, IEEE, pp. 487-491.

* cited by examiner

*Primary Examiner*—Afsar M. Qureshi

(57) ABSTRACT

The present invention, generally speaking, provides for true multi-mode operation enabling mode switching to be done on-the-fly, in real time. Ramping techniques are provided to fully ramp a communications signal down and then back up inside a guard period while switching from one mode to another so that signal glitches occur only while the signal is ramped down and so can be made negligible. In another aspect of the invention, an advantageous multi-mode communications platform having a polar modulation architecture is provided. Preferably, the platform is based on a multi-mode, predominantly digital, single-chip communications signal processor. A digital, phase-stable, frequency lock loop enables versatile, low-power operation.

21 Claims, 17 Drawing Sheets

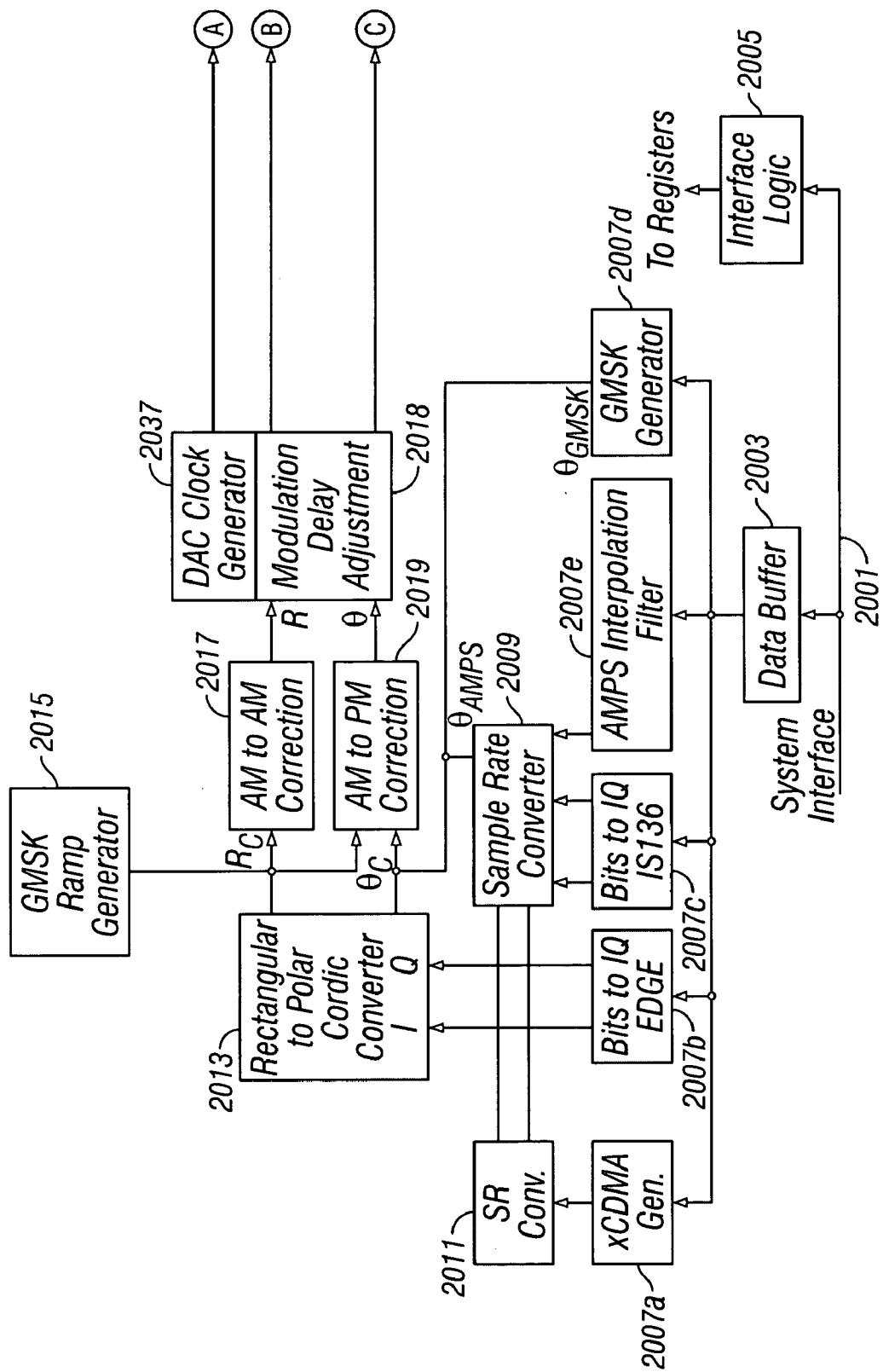
FIG. 20-A

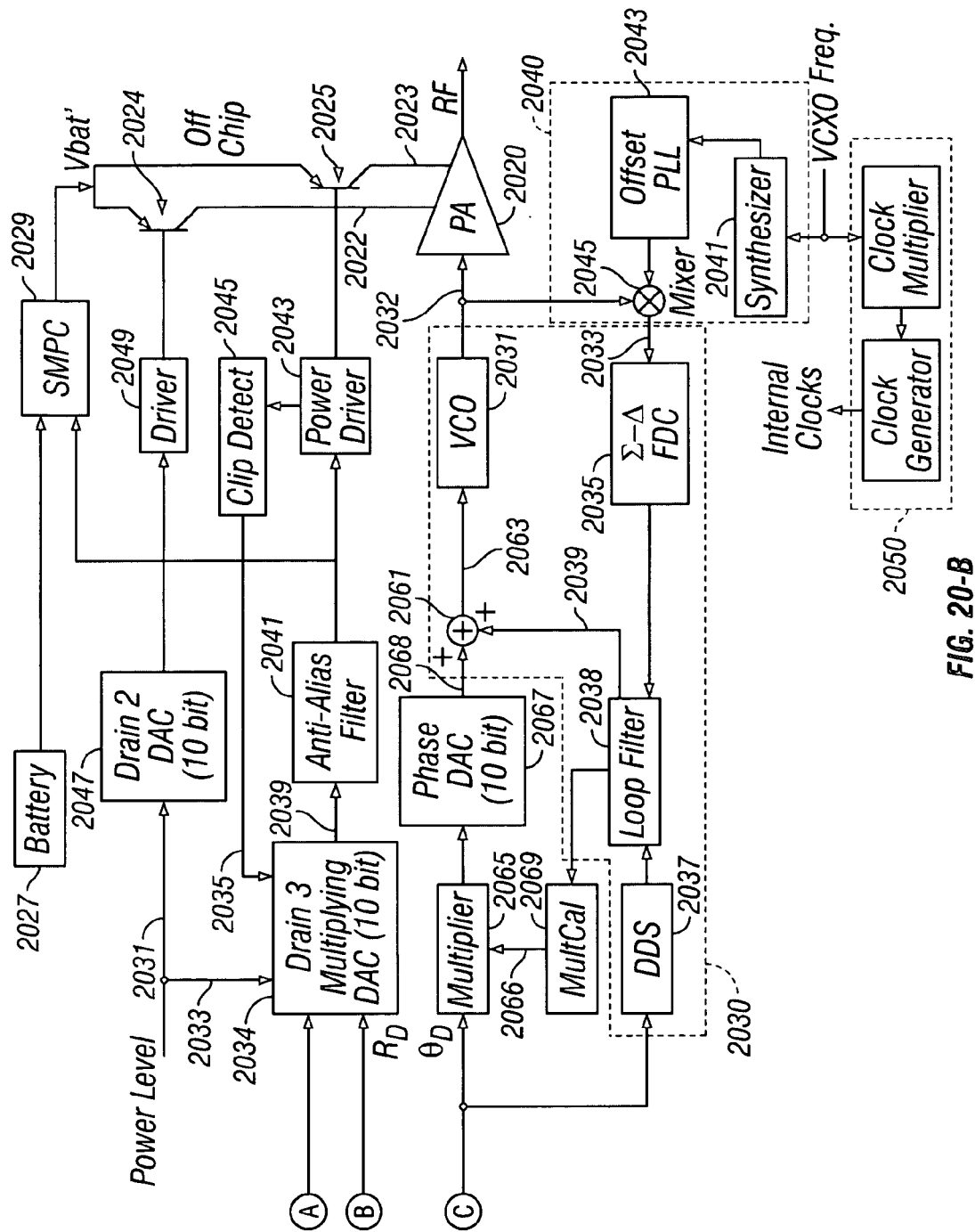
FIG. 20-B

MULTI-MODE COMMUNICATIONS TRANSMITTER

BACKGROUND OF THE INVENTION

1. Field of the Invention

The present invention relates to multi-mode communications transmitters.

2. State of the Art

Different mobile communications systems are prevalent in different geographical regions. Example systems include those specified by the GSM and ANSI-136 standards, which are time division multiple access (TDMA) communication systems, the CDMA standard (IS-95), and combinations of the same (so-called multi-mode systems). Furthermore, the proliferation of competing standards is increasing with the adoption of different 2.5 and 3G mobile communications standards, such as EDGE, UMTS (WCDMA), CDMA2000, etc. Hence, although the vision of a "world phone" has been repeatedly articulated, progress toward that goal has been slow and difficult. Various current products offer multi-band operation for a particular standard. Fewer products offer multi-standard (i.e., multi-mode) operation. True multi-mode operation should enable mode switching to be done on-the-fly, in real time.

In TDMA communication systems, high quality RF (radio frequency) signals must ramp quickly from a condition of minimal output power to a condition of information-bearing modulation at a specified output power and back down to the condition of minimal output power. Such power ramping capability is illustrated in FIG. 1.

A fundamental requirement of these transmitters is that the acts of ramping up and ramping down must not violate specified limits on peak power in spectral bands away from the assigned RF channel (e.g., bands that would be allocated to other transmitters); the associated measurement is called the transient spectrum in some systems or the transient adjacent channel power (transient ACP) in others.

Present power ramping techniques must be tailored for each modulation type, and typically require unit-by-unit calibration (at least in the case of typical GMSK transmitters and conventional multi-mode transmitters). Even so, transient ACP performance is usually very sub-optimal.

Considerable challenges to true multi-mode operation where mode switching is done on-the-fly, in real time, are posed by the following problems: (a) how to fully ramp a communications signal down and then back up inside a guard period while switching from one mode to another so that signal glitches occur only while the signal is ramped down and so can be made negligible; or, alternatively, (b) how to change smoothly from one modulation to another without being fully ramped down.

Furthermore, if different hardware paths are used for the different modulations, then mode switching is even more difficult, as there may be switching transients when switching between the hardware paths, and these transients may or may not be controllable.

Other issues relate to signal quality, both in-band (as measured by error vector magnitude, or EVM) and out-of-band (as measured by power spectral density, or PSD). Maintaining high signal quality over a wide range of output powers for multiple standards poses a particular challenge.

The present invention is applicable to both conventional (I/Q) and polar modulation architectures. Polar modulation architectures, and similar architectures in which separate amplitude and phase paths are provided, are described, for example, in U.S. Pat. Nos. 6,191,653, 6,194,963, 6,078,628, 5,705,959, 6,101,224, 5,847,602, 6,043,707, and 3,900,823, as well as French patent publication FR 2768574, all of which are incorporated herein by reference.

SUMMARY OF THE INVENTION

The present invention, generally speaking, provides for true multi-mode operation enabling mode switching to be done on-the-fly, in real time. Ramping techniques are provided to fully ramp a communications signal down and then back up inside a guard period while switching from one mode to another so that signal glitches occur only while the signal is ramped down and so can be made negligible. In another aspect of the invention, an advantageous multi-mode communications platform having a polar modulation architecture is provided. Preferably, the platform is based on a multi-mode, predominantly digital, single-chip communications signal processor. A digital, phase-stable, frequency lock loop enables versatile, low-power operation.

BRIEF DESCRIPTION OF THE DRAWING

The present invention may be further understood from the following description in conjunction with the appended drawing. In the drawing:

FIGS. 20A–20B is a block diagram of a multi-mode transmitter in accordance with another embodiment of the invention.

DETAILED DESCRIPTION OF THE PREFERRED EMBODIMENTS

Figure 1:
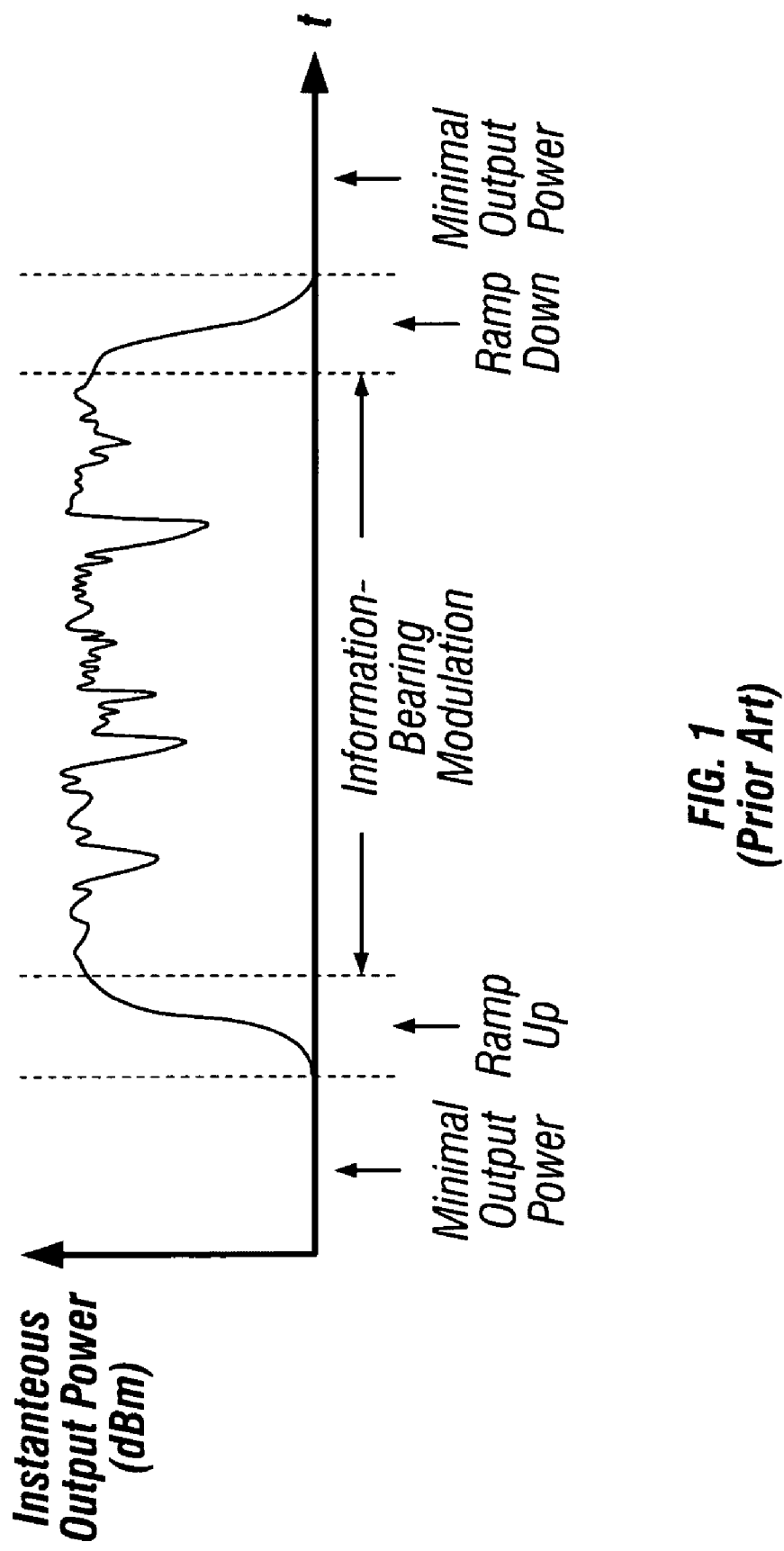
FIG. 1 is a diagram illustrating power ramping in a communication system.
Figure 2:
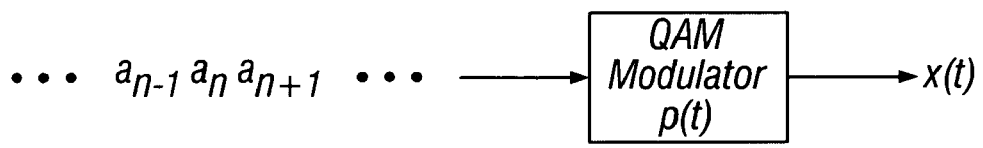
FIG. 2 is a diagram illustrating operation of a conventional QAM modulator using a pulse shaping filter having an impulse response given by p(t)
Figure 3:
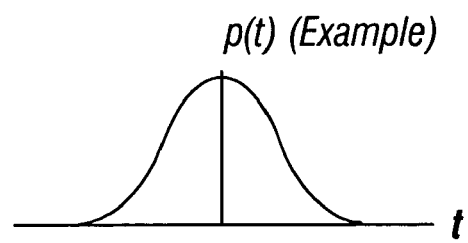
FIG. 3 is a diagram of one example of p(t)

For nearly all systems of interest, the complex envelope x(t) of an information-bearing modulation can be expressed by the well-known equation $$x(t) = \sum_n a_n p(t - nT)$$

which is equivalent to $$x(nT + \tau) = \sum_{k=0}^{L} a_{n-k} p(kT + \tau)$$

where $a_n$ is the n-th complex-valued symbol (typically drawn from a discrete constellation), p(t) is the impulse response at time t of a pulse-shaping filter, and T is the symbol period. Time t can be either continuous or discrete. Operation of a conventional QAM modulator using a pulse shaping filter having an impulse response given by p(t) is illustrated in FIG. 2. Due to the desire to maintain spectral efficiency, p(t) is typically a smooth pulse-like function as shown for example in FIG. 3.

In the present description, the term "modulator" is used in two different contexts. One usage refers to a complex envelope generator such as that of FIG. 2, the details of which are dependent upon a particular chosen modulation. The other usage refers to circuitry used to create an information-bearing (i.e., modulated) signal at radio frequency, in some instances using a complex envelope signal of the type described. These two different usages will be readily distinguishable by one of ordinary skill in the art, according to context.

Figure 4:
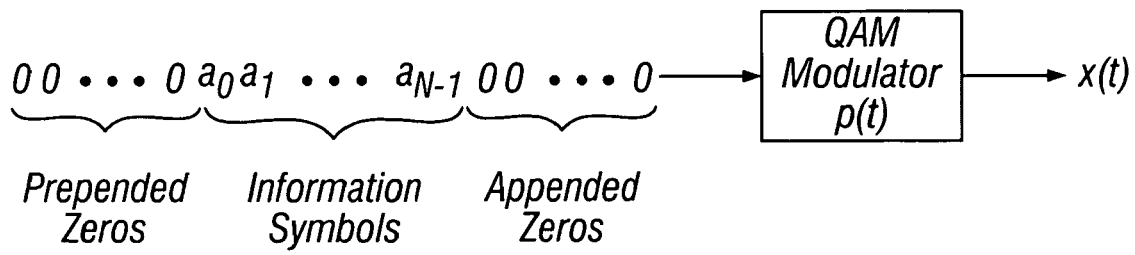
FIG. 4 is a diagram illustrating operation of a QAM modulator using prepended and appended zero-valued symbols to control ramping.

An important observation, previously unknown either with respect to polar modulators or conventional modulators, is exploited in accordance with the present invention to achieve ramping having the advantageous characteristics previously mentioned. It is that by prepending and appending a few zero-valued symbols to the finite-length sequence of information symbols belonging to a burst, the resulting complex envelope x(t) naturally ramps up and down precisely as required. Furthermore, it can be shown mathematically that the transient spectral properties of x(t) during these ramps are no worse than during the information-bearing modulation. A diagram illustrating operation of a QAM modulator using prepended and appended zero-valued symbols to control ramping is shown in FIG. 4.

Figure 5:
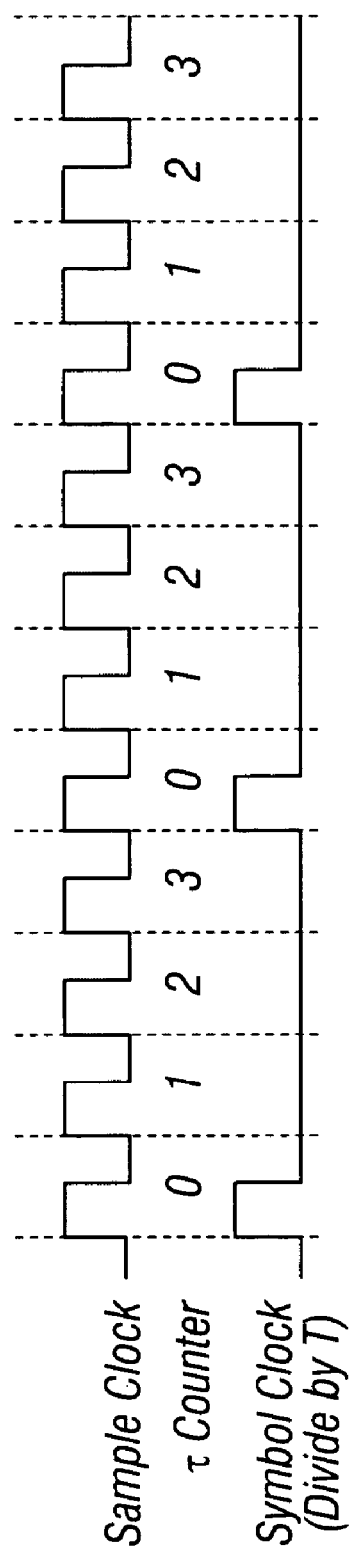
FIG. 5 is a timing diagram of timing signals used in the circuitry of FIG. 6.
Figure 6:
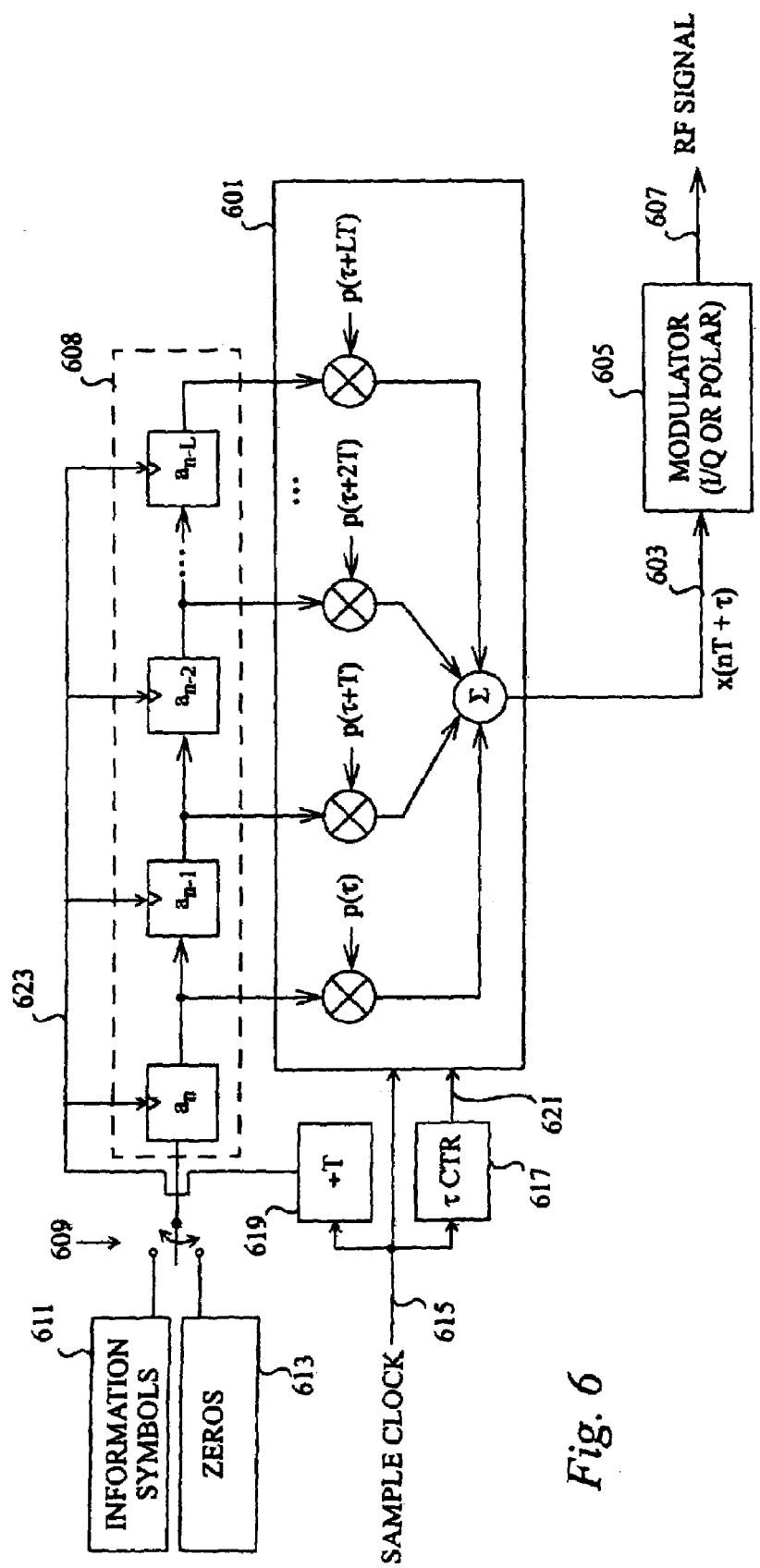
FIG. 6 is a diagram of a portion of a transmitter including ramp control circuitry in accordance with an exemplary embodiment of the invention.

FIG. 6 shows a portion of a transmitter including ramp control circuitry in accordance with an exemplary embodiment of the invention. Prior to describing the circuitry of FIG. 6, it will be useful to understand the relationship of certain timing signals used in the circuitry of FIG. 6. These timing signals are shown in FIG. 5. A sample clock signal is divided by some number T to obtain a symbol clock. A $\tau$ counter counts the sample clock pulses within one period of the symbol clock. In the example of FIG. 5, T=4.

Referring now to FIG. 6, a pulse shaping filter 601 having impulse response coefficients p(0), p(1), . . . , p((L+1)T−1) receives from a tapped delay line or shift register a group of symbols $a_n, a_{n-1}, a_{n-2}, \ldots, a_{n-L}$. (For purpose of the present description, a shift-register implementation will be assumed.) As $\tau$ cycles through 0, 1, 2, . . . , T−1, the indices $\tau, \tau+T, \tau+2T, \ldots, \tau+LT$ select a subset of the impulse response coefficients for application within the circuit at a particular time. The subsets of impulse response coefficients applied at a particular time may be described as follows: at $\tau=0$, the subset is {0, T, 2T, . . . , LT}; at $\tau=1$, the subset is {1, T+1, 2T+1, . . . , LT+1}; at $\tau=2$, the subset is {2, T+2, 2T+2, . . . , LT+1}, and so forth, until at $\tau=T-1$, the subset is {T−1, 2T−1, 3T, . . . , LT+T−1}. Hence, as $\tau$ cycles through 0, 1, 2, . . . , T−1, the entire range of impulse response coefficients p(0), p(1), . . . , p((L+1)T−1) will have been applied.

The pulse filter of FIG. 6 is essentially a superposition filter, described more fully, for example in McCune, Synthesis of a Superposition Based FIR Digital Baseband Filter, IEEE Midwestern Symposium on Circuits and Systems, 1998 proceedings, incorporated herein by reference.

The pulse filter forms an output signal 603 given by x(nT+$\tau$), which is applied to an I/Q modulator or polar modulator 605 to form an RF signal 607. Prepending and appending of zero-valued symbols for ramp control is accomplished by inputting values to a shift register 608 through an input selector or switch 609, connected to either a source of information symbols 611 or to a source of zero values 613. A sample clock 615 is input directly to the pulse-shaping filter, and is input also to a $\tau$ counter 617 and a divide-by-T counter 619. The $\tau$ counter produces a count 621 that is input to the pulse-shaping filter. The divide-by-T counter produces from the sample clock a symbol clock 623 that is input to the shift register and applied to clock the individual stages of the shift register.

In operation, upon receipt of the first information-bearing symbol $a_0$, the initial state (n=0) of the shift register is $a_{n-1}=a_{n-2}=\ldots=a_{n-L}=0$. As additional symbols are received, they are shifted into the shift register. With each tick of the sample clock, the counter or index $\tau$ is updated, modulo T; $\tau$ therefore cycles through the sequence 0, 1, . . . , T−1, 0, 1, . . . , T−1, . . . . After the last information symbol enters the shift register, the input selector switches to accept zeros during the next L ticks of the symbol clock, until the shift register state is $a_n=\ldots=a_{n-L+1}=0$ and $a_{n-L}=a_{N-1}$, where N is the number of symbols in a burst. In this state, the ramp-down is complete once $\tau=T-1$ is reached.

Figure 7:
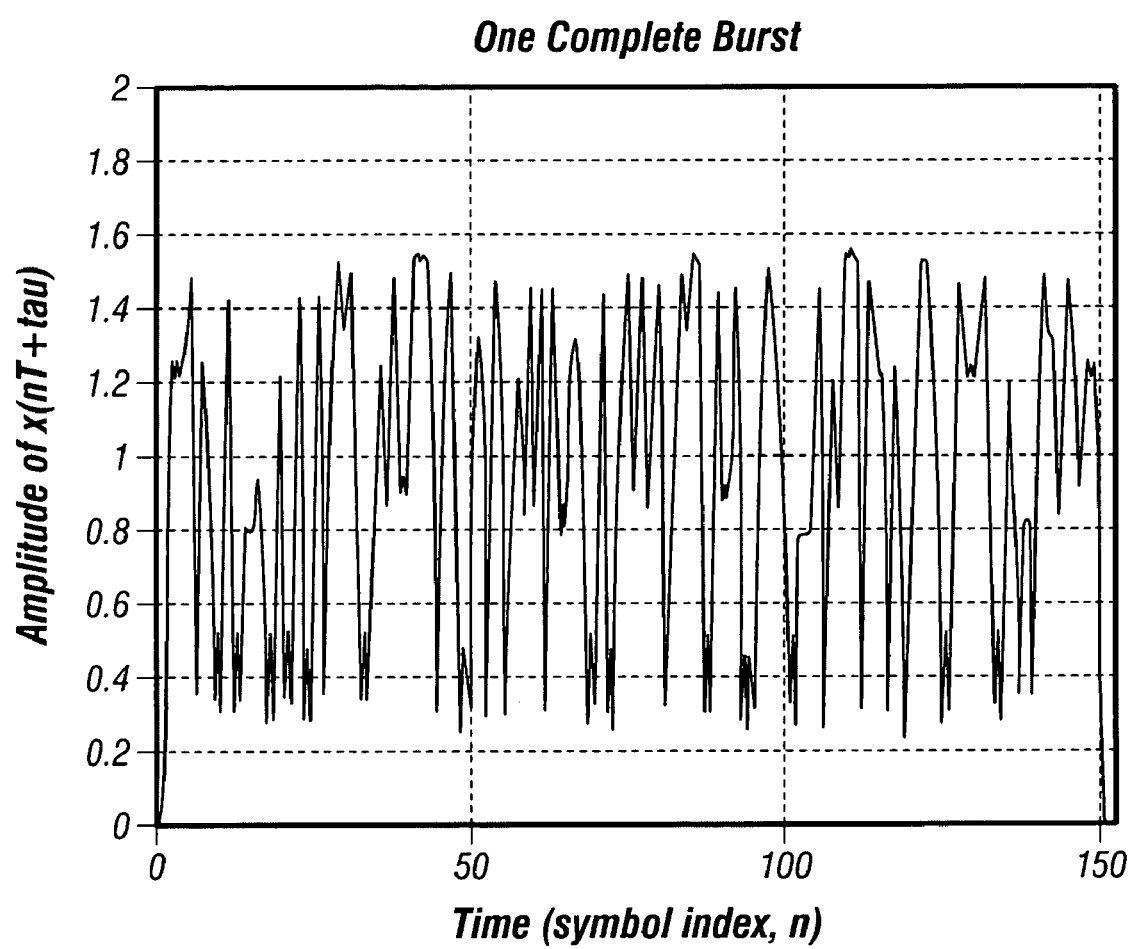
FIG. 7 is a signal plot of results obtained using the ramp control circuit of FIG. 6.
Figure 8:
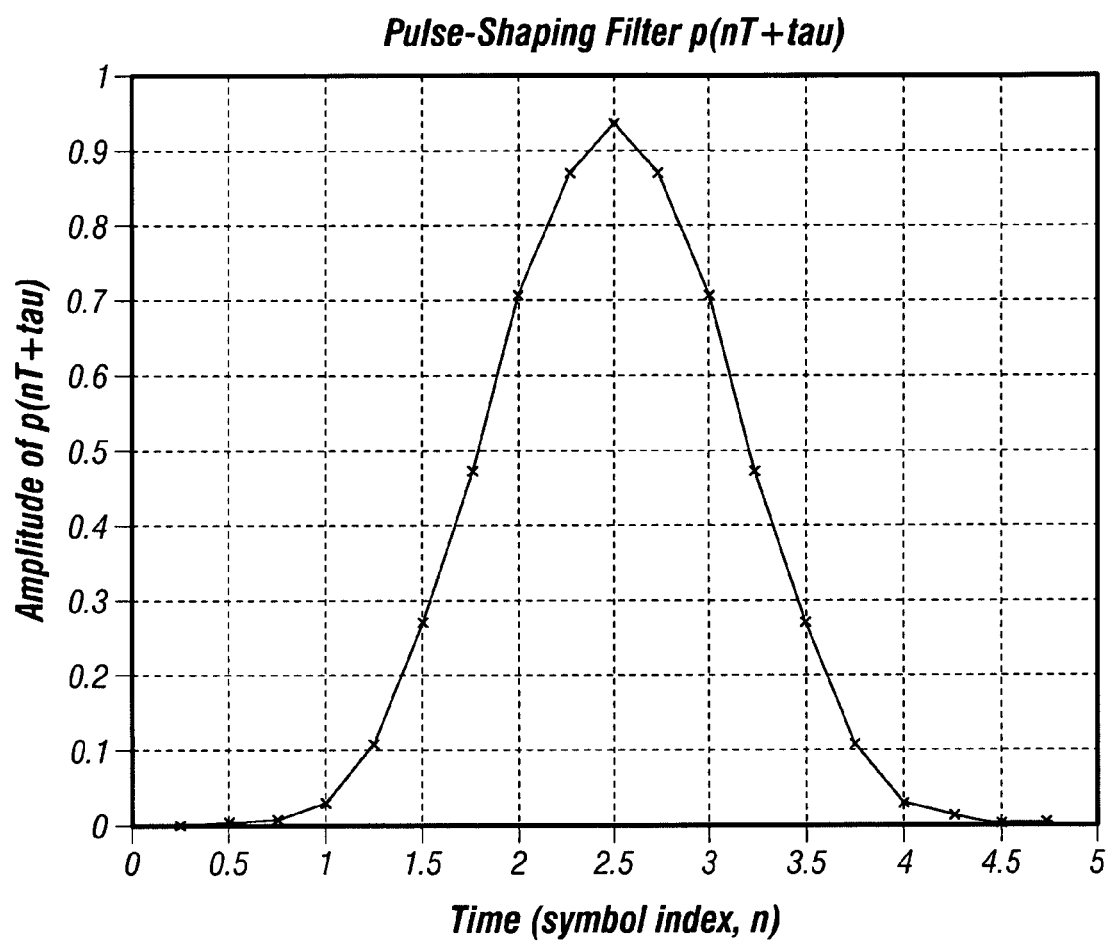
FIG. 8 is a diagram of a pulse shaping filter function p(t) used in the example of FIG. 7.

Results of this technique for one complete burst with N=148 symbols are shown in the plot of FIG. 7. In this example, an EDGE pulse (illustrated in FIG. 8) was used, with T=4 (i.e., four samples per symbol) and L+1=5 (i.e., a shift register of length five).

Figure 9:
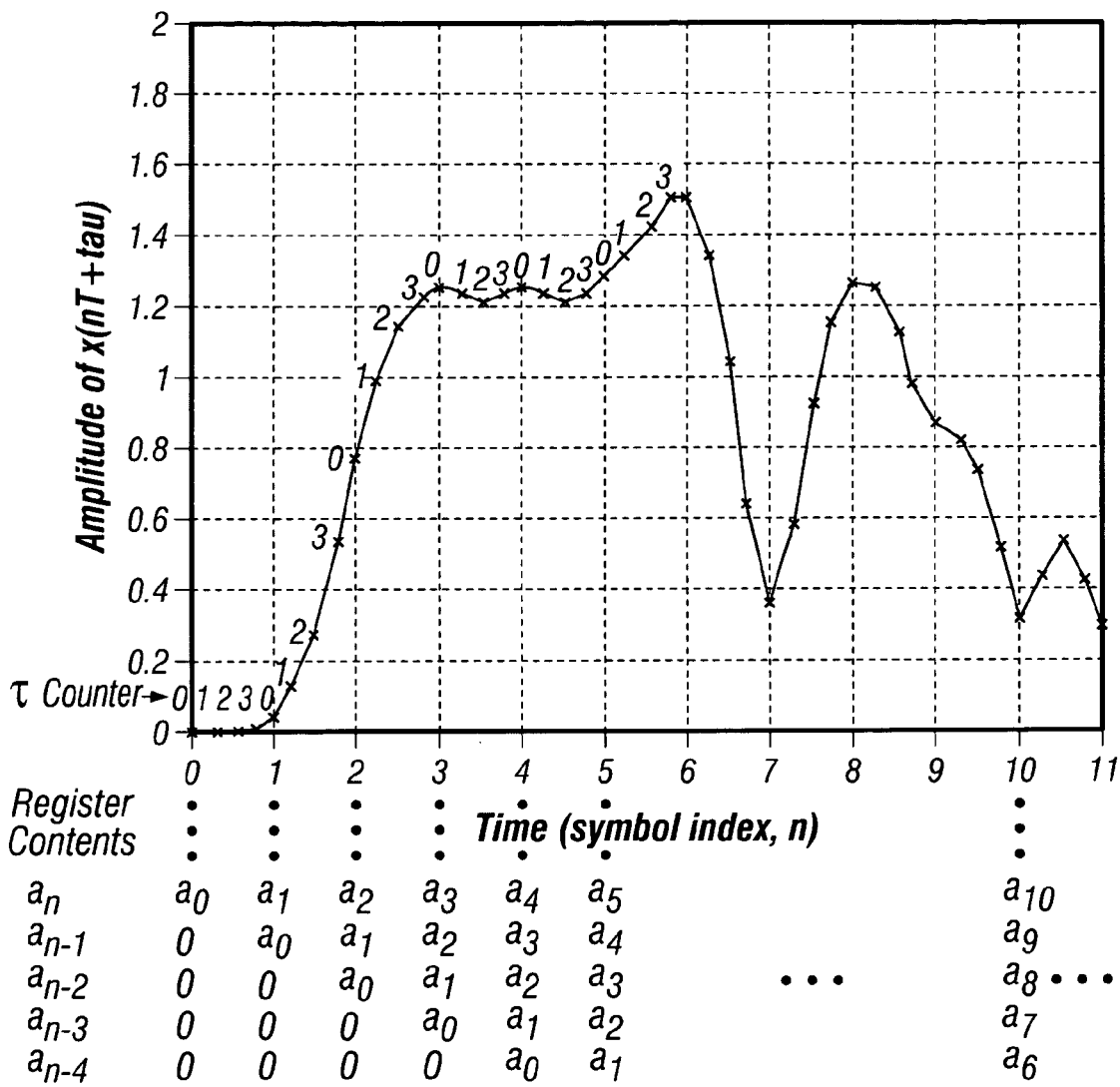
FIG. 9 is an exploded view of the rising edge of the ramp of a signal plot like that of FIG. 7.

FIG. 9 shows an exploded view of the rising edge of the ramp of a signal plot like that of FIG. 7, annotated to show the value of the $\tau$ counter at each output sample, along with the contents of the shift register, updated as each new symbol is input. Note that the ramp up is basically complete within three symbols periods of the first information symbol entering the shift register.

Figure 10:
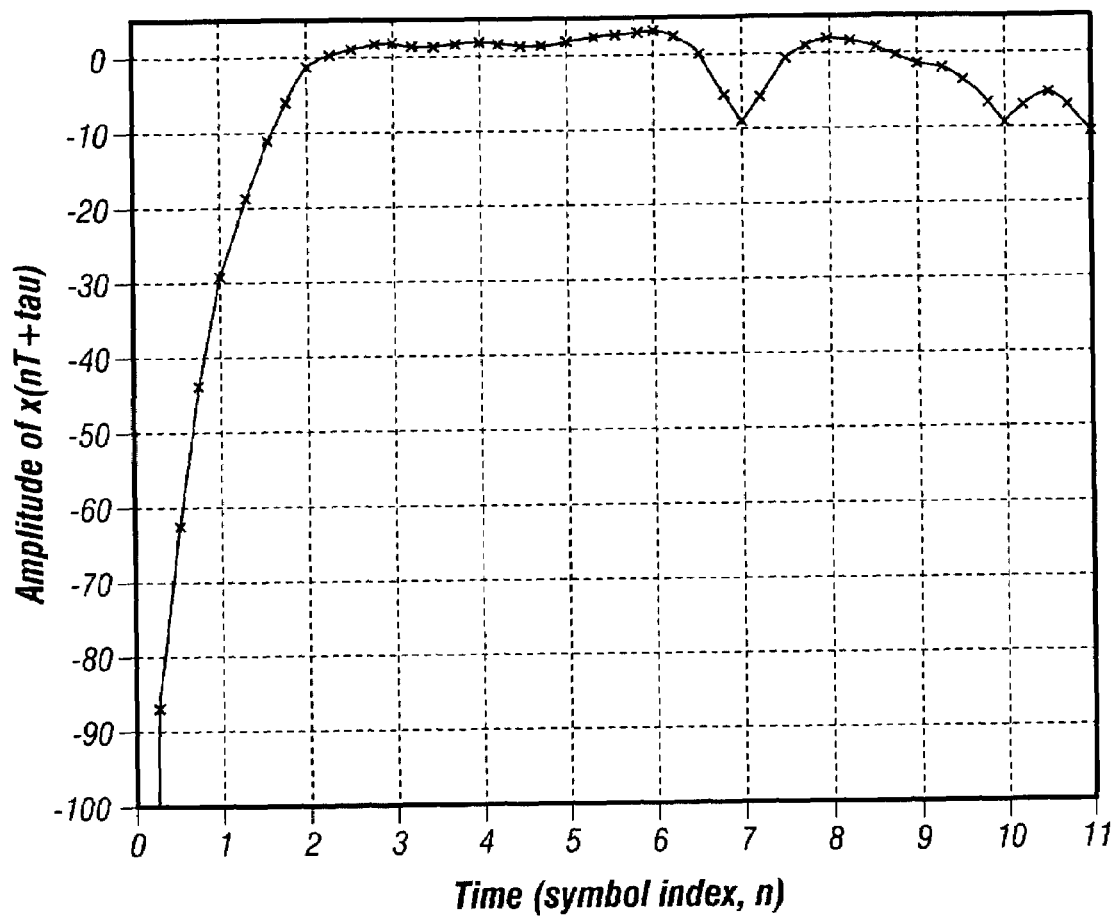
FIG. 10 shows the rising edge of the ramp of FIG. 9 when viewed on a logarithmic (dB) scale.

FIG. 10 shows the rising edge of the ramp when viewed on a logarithmic (dB) scale. Here it can be seen that the signal amplitude during the first symbol period is over 40 dB down from the peak. In most systems (including those complying with the EDGE specification), such small signal components can be significantly distorted (e.g., clamped at zero) without causing measurable degradation of system performance (e.g., transient ACP). Various power amplifier control signals can therefore be abruptly switched during such low-amplitude times without performance degradation, as described in greater detail hereinafter.

Figure 11:
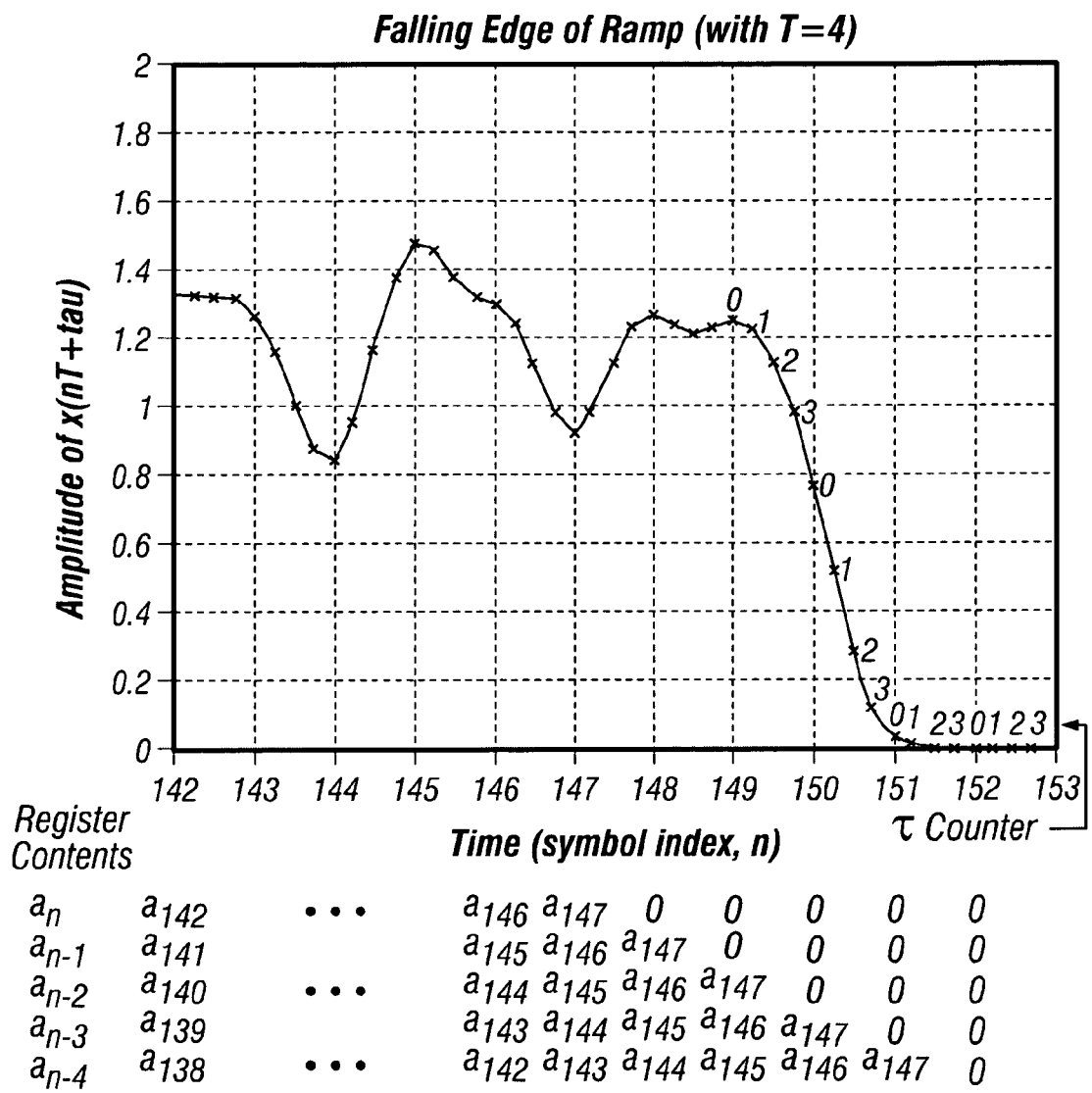
FIG. 11 is similar to FIG. 9 but shows the falling edge of the ramp.

FIG. 11 is similar to FIG. 9 but shows the falling edge of the ramp, with zero-valued symbols entering the shift register after the last information symbol. This appending of zero-valued symbols is accomplished in the example embodiment of FIG. 6 when the input selector switches to the zero source, after the symbol clock at index n=147 but before the next symbol clock at n=148.

Figure 12:
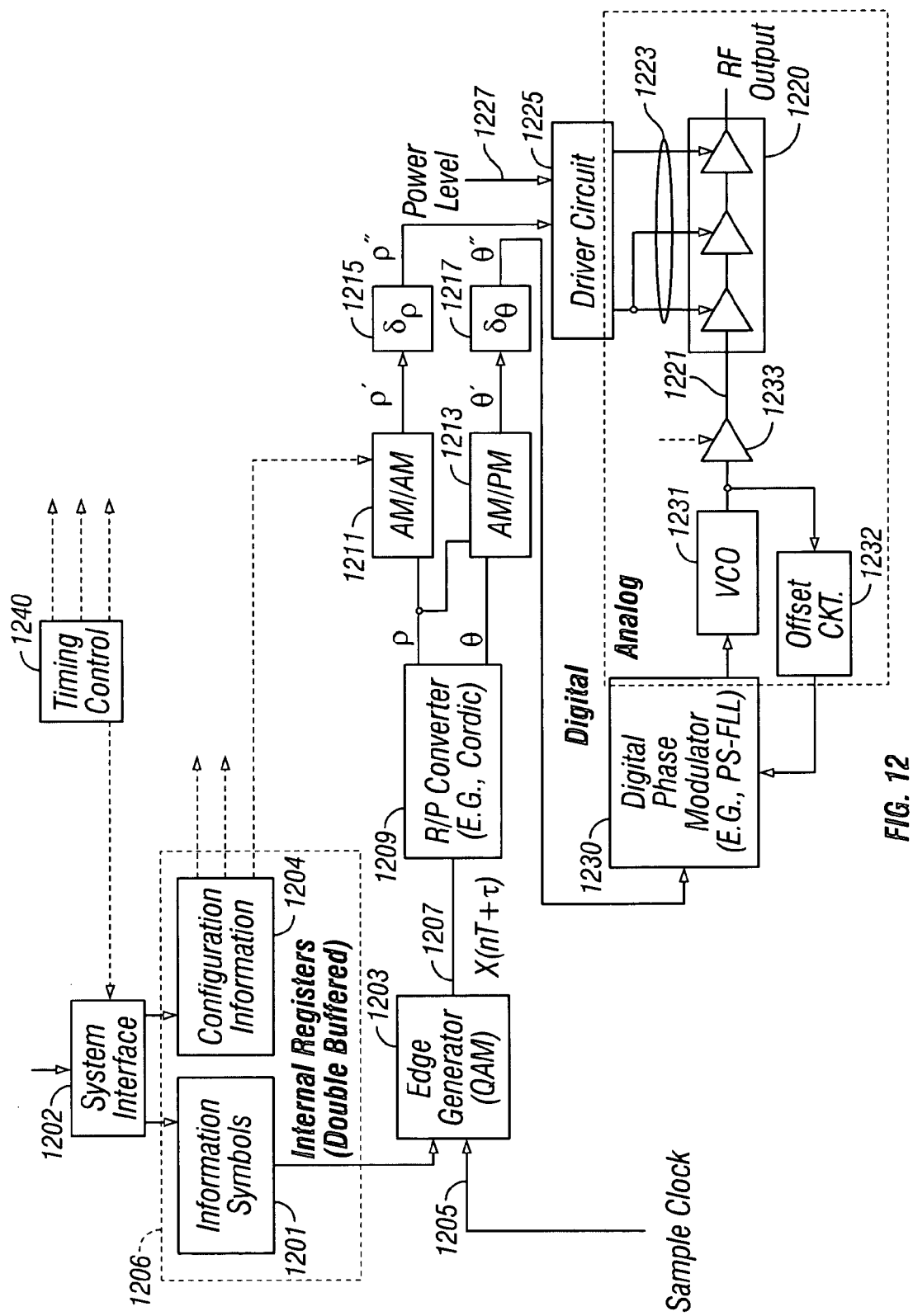
FIG. 12 is a block diagram illustrating application of the present ramping technique in a polar modulation architecture.

FIG. 12 is a block diagram illustrating application of the present ramping technique in a polar modulator architecture, i.e., one having separate amplitude and phase paths. On a burst-by-burst basis, both configuration information and information to be transmitted are received through a system interface 1202 and stored in internal registers 1206. For purpose of illustration, a register section 1204 storing configuration information and a register section 1201 storing information to be transmitted (e.g., data symbols) are shown separately. In an exemplary embodiment, the internal registers 1206 are doubled buffered. In this manner, as one transmission burst is proceeding, data for the next transmission burst may be received and stored. Configuration information (1204) and timing control information (block 1240) are shown generally as being provided to various points within the overall circuit.

Data symbols are input to a pulse modulator 1203, such as an EDGE QAM modulator, in accordance with a symbol clock 1205. The modulator produces a complex envelope signal 1207, for example an envelope signal like that of FIG. 7, given by x(nT+τ). The envelope signal is processed by a rectangular-to-polar converter 1109 (such as a CORDIC converter), producing magnitude and phase signals ρ and θ.

In an exemplary embodiment, the latter signals are corrected for non-linearities and are time-aligned to account for path delay differences. Hence, the magnitude signal is applied to an AM/AM look-up table 1211, an output ρ' of which is delayed a controlled amount by a magnitude delay element 1213 to produce an output ρ". The phase and magnitude signals are applied to an AM/PM look-up table 1215, an output θ' of which is delayed a controlled amount by a phase delay element 1217 to produce an output θ". The delays of the magnitude delay element and the phase delay element are controlled to achieve proper magnitude and phase alignment at an amplification chain 1220.

In the illustrated embodiment, power-level-specific AM/AM and AM/PM correction values for a particular burst are received and stored prior to the burst as part of the configuration information 1204. For both AM/AM and AM/PM correction, piece-wise-linear interpolation may be used, in which some small number of table values (e.g., eight) may be used to define a piece-wise-linear correction-value curve as a function of ρ, the actual correction value used being interpolated based on the table values. In other embodiments, correction tables for a complete range of power levels may be stored within the circuit, eliminating the need to obtain correction values during operation through the system interface.

The amplification chain 1220, in an exemplary embodiment, includes three cascaded stages, realized for example using FET devices. The stages are drain modulated and driven in switch mode or, for low-power operation, in "multiplicative" mode, as described more particularly in U.S. patent application Ser. No. 09/839,024 entitled COMMUNICATIONS SIGNAL AMPLIFIERS HAVING INDEPENDENT POWER CONTROL AND AMPLITUDE MODULATION, filed on Apr. 11, 2001 and incorporated herein by reference. An RF input port 1221 of the amplification chain may be regarded as the phase port, and the drains (or power supply inputs) of the stages may be regarded together as the amplitude port 1223.

The amplitude port is driven by a driver circuit 1225, responsive to the signal ρ" and to a power level input signal 1227.

The phase port is driven by a digital phase modulator 1230, preferably a digital phase modulator having a phase-stable frequency locked loop as described in U.S. Pat. No. 6,094,101 of the present assignee (incorporated herein by reference) in combination with a VCO 1231. A feedback loop from the VCO back to the digital phase modulator includes a frequency offset circuit 1232. The VCO 1231 may be isolated from the amplification chain 1220 using a variable gain amplifier (VGA) or a variable attenuator that is responsive to another power level input signal. Alternatively, the VCO may be isolated from the power amplifier using a buffer amplifier. These alternative are represented in FIG. 12 by a variable gain amplifier 1233 that may have a gain that is zero (in the case of the buffer amplifier), negative (in the case of an attenuator) or positive.

The timing control block 1240 provides timing signals to the symbol source and to the driver circuit, as well as to the buffer amplifier (described more filly below), if present.

The transmitter of FIG. 12 is mainly digital, the digital and analog portions being separated by a dashed line.

The same principles described thus far, particularly with respect to ramping of the EDGE modulator, may be readily extended to embrace other modulation types, such as IS-136, also known as North American Digital Cellular or D-AMPS. The particulars of D-AMPS, however, require certain modifications to the foregoing approach.

Figure 13:
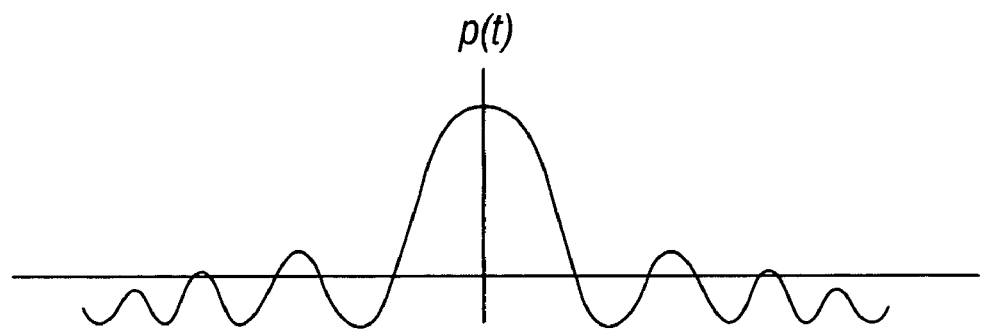
FIG. 13 is a diagram of a pulse shaping filter function n(t) used for D-AMPS.

In particular, the pulse shape used in D-AMPS, shown in FIG. 13, is theoretically of infinite duration (unlike the EDGE pulse, which has a finite duration of 5 symbol periods). Of course, in practice, this infinite-duration pulse is truncated, the choice of the truncation interval (i.e., interval outside of which the pulse is truncated) determining the spectral characteristics (including adjacent-channel power—ACP—and transient ACP) of the output signal. Using the foregoing method of ramping, to obtain low side lobes, a truncation interval in the range of 8–16 symbol periods would be required, corresponding to a ramp-up time in the range of 4–8 symbol periods and a ramp-down time in the range of 4–8 symbols periods. Unfortunately, such prolonged ramp times exceed the 3 symbol period duration specified in the D-AMPS standard. Therefore, in order to use the foregoing method for D-AMPS, or for multiple QAM modulations including EDGE, D-AMPS, etc., a mechanism of ramp acceleration is required whereby the prolonged ramp times of D-AMPS may be shortened to satisfy the specified ramp mask.

Figure 14:
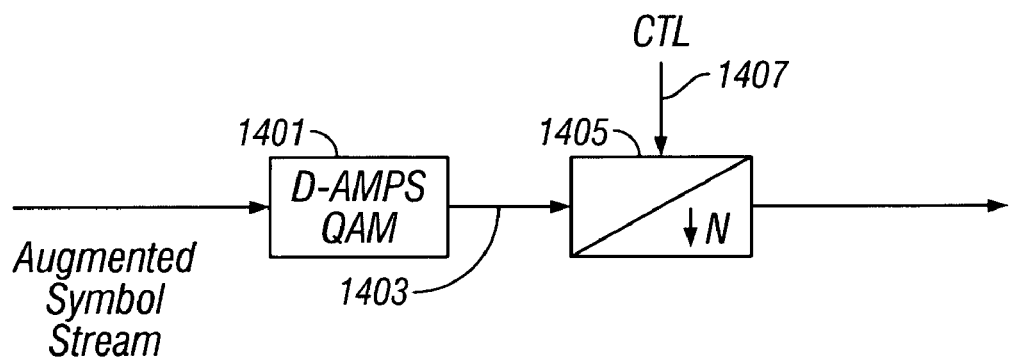
FIG. 14 is a diagram of a portion of a communications transmitter implementing ramping for D-AMPS.

One way of achieving such ramp acceleration is illustrated in FIG. 14. Here, a D-AMPS QAM modulator 1401 is provided, zero-valued symbols being prepended and appended to the information symbols belonging to a burst, as previously described in relation to EDGE. The modulator produces a digital output signal 1403 having a prescribed symbol rate. This digital output signal is applied to a discard unit 1405 controlled by a control signal 1407 from a timing generator (not shown). During ramp-up and ramp-down, a control signal is applied to the discard unit to cause it to discard selected samples (which has the equivalent effect of accelerating the time base). For example, every other sample may be discarded, resulting in 2× acceleration. During the information burst, the discard unit passes the sample stream from the modulator unchanged.

In an exemplary embodiment, the ramp-up and ramp-down times using ramp acceleration are three symbol times in duration, satisfying the specified ramp mask.

Since the signal at the original sampling rate is oversampled and is naturally bandlimited, discarding every other sample does not create spectral side lobes or aliasing, and does not destroy signal information.

Various other means of accomplishing ramp acceleration will be apparent to those skilled in the art. For example, instead of the discard unit, an arbitrarily variable sample rate converter (sometimes referred to as an asynchronous sample rate converter) of a type known in the art may be used. Using such a sample rate converter, the desired acceleration, instead of being limited to discrete values, may be arbitrarily chosen.

The foregoing methods are not directly applicable to PM or FM (i.e., constant envelope) signals such as the GMSK signal used in GSM, wherein zero-valued symbols do not result in a zero-level output signal. However, in the case of the GMSK signal, its ideal spectrum is practically identical to that of the EDGE signal, suggesting that the same ramp shape used for EDGE could also be used for GMSK. In one particular embodiment, the first half of the EDGE pulse, p(0), p(1), . . . , p(2.5T), is used as the GMSK ramp shape for ramp up, and the rest of the EDGE pulse, p(2.5T), p(2.5T+1, . . . , p(4T+T−1), is used as the GMSK ramp shape for ramp down. The EDGE pulse has the characteristic that the squared magnitude of its Fourier transform is approximately proportional to the power spectrum of the GMSK communications signal.

Figure 15:
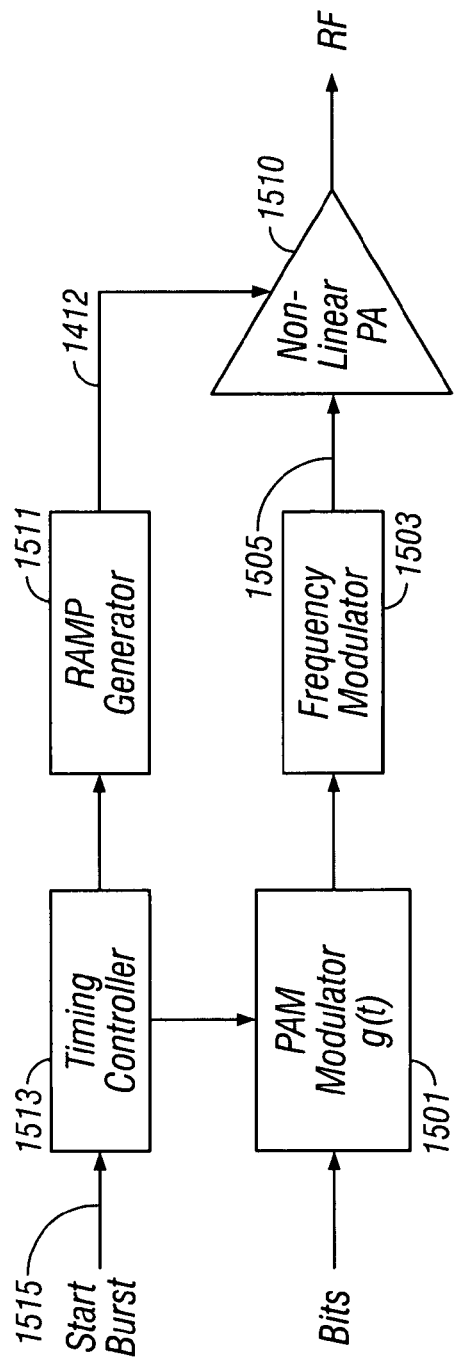
FIG. 15 is a block diagram illustrating GMSK ramping in a polar modulation architecture.

FIG. 15 illustrates application of the foregoing ramping technique for GMSK in a polar architecture having separate amplitude and phase paths. A phase path includes a GMSK PAM modulator 1501 and a frequency modulator 1503, the combination of which generates the final GMSK signal 1505. (The PAM modulator has a pulse shaping filter with an impulse response g(t) tailored for GMSK.) The PAM modulator receives bits from a bit source (not shown). The bits are used by the PAM modulator and the frequency modulator to generate the GMSK signal 1505, which is applied to a phase port of a non-linear power amplifier (PA) 1510. An amplitude path includes a "hard-coded" ramp generator 1511 that uses values from the EDGE pulse p(t) as previously described to generate a ramp signal 1512 that is applied to an amplitude port of the PA 1510. A timing controller 1513 receives a Start Burst signal 1515 and generates timing signals for the ramp generator and for the PAM modulator. In particular, the ramp generator and the PAM modulator are activated such that by the time an information bearing signal is applied to the phase port of the non-linear PA, the RF output signal has been fully ramped up.

By using a non-linear PA, performance variations between production units are predictably small, with the result that the kind of unit-by-unit ramping calibration necessitated in the prior art may be eliminated—an important advantage over conventional techniques using linear circuit designs.

Figure 16:
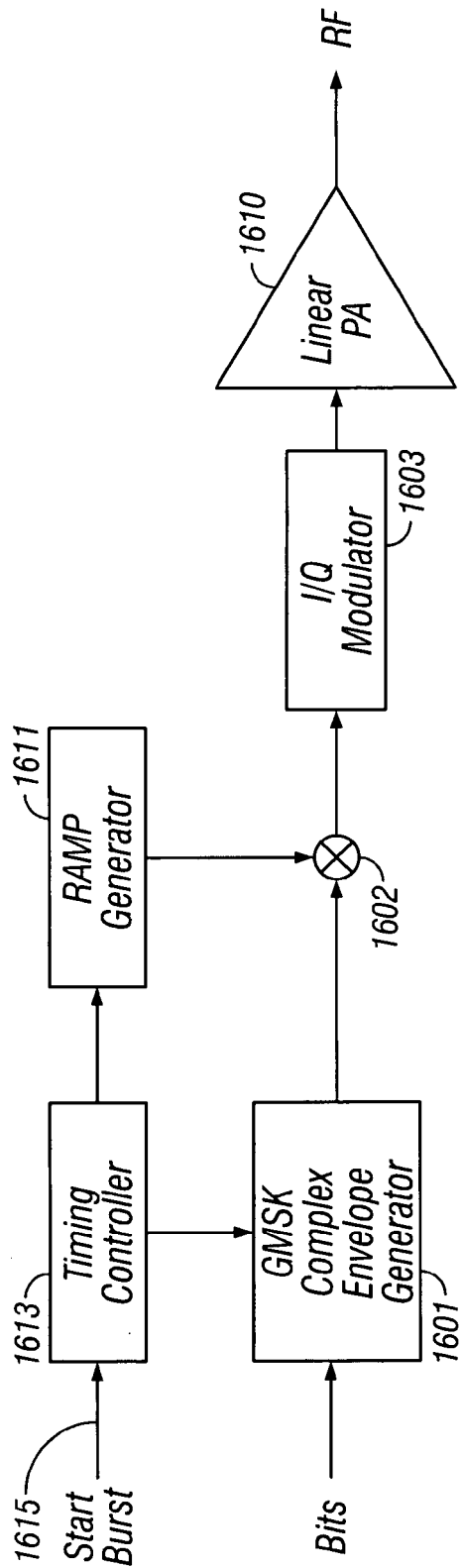
FIG. 16 is a block diagram illustrating GMSK ramping in an I/Q architecture.

FIG. 16 illustrates application of the foregoing ramping technique for GMSK in a conventional I/Q architecture having a single signal path combining amplitude and phase information. In this embodiment, the PAM/FM combination of the embodiment of FIG. 15 are replaced by a GMSK complex envelope generator 1601, a multiplier 1602 and an I/Q modulator 1603. A timing controller 1613 receives a Start Burst signal 1615 and generates timing signals for the ramp generator and for the GMSK complex envelope generator. In particular, the ramp generator and the GMSK complex signal generator are activated such that by the time an information bearing signal is applied to the multiplier 1602, the output signal of the ramp generator has completed a ramp-up portion.

Figure 17:
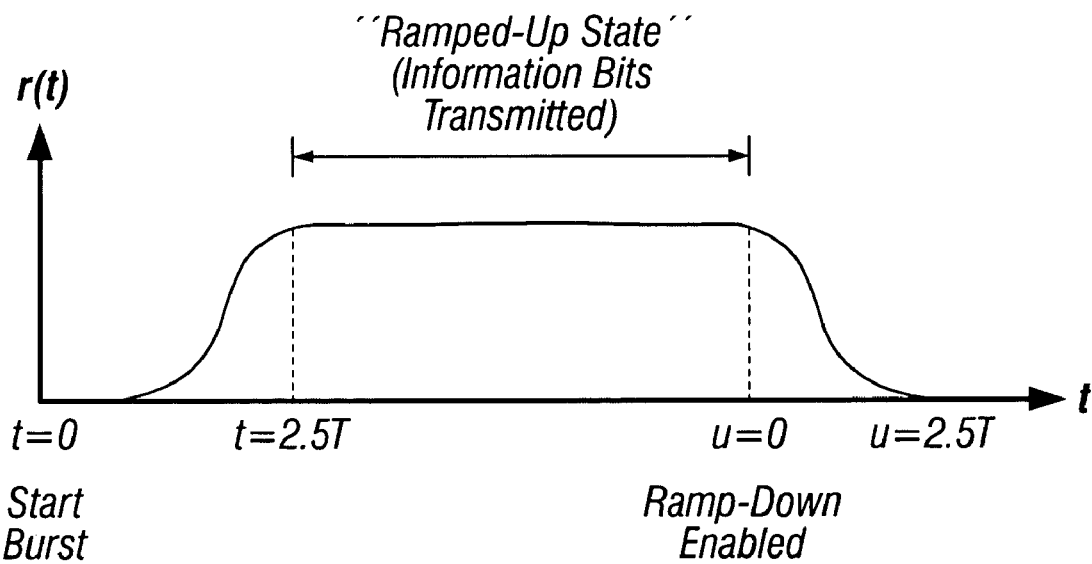
FIG. 17 is a diagram illustrating the output r(t) of the ramp generator in FIG. 15 and FIG. 16.

The output r(t) of the ramp generator of the foregoing embodiments is shown in FIG. 17. The start of a burst corresponds to time t=0, at which time ramping up begins. Ramping up is complete at time t=2.5T, whereupon a "ramped-up" state begins during which information bits are transmitted. At the end of the ramped-up state, a "ramp-down" signal is generated, at a time designated as t=u. The ramp-down state continue until time t=u+2.5T. The output r(t) may therefore be expressed as:

$$r(t) = \begin{cases} p(t), & 0 \le t \le 2.5T \\ p(2.5T), & 2.5T \le t \le u \\ p(2.5T+t-u), & u \le t \le u+2.5T \end{cases}$$

The duration of the ramped-up state may be defined in a digital logic implementation using a programmable counter, as is apparent to those skilled in the art of digital logic design. Upon expiration of the counter, the ramp-down signal is enabled. Similarly, counters may be used in a simple state machine to generate the indices t and u to be used in looking up values of p(t) used to define r(t). Other means providing equivalent signals r(t) may be used as well.

Instead of storing p(t) values directly on chip, a savings in area may be obtained by instead storing the $N^{th}$-order differences of the sequence of values. To "recall" the original sequence of values, their $N^{th}$-order differences are recalled and processed using an $N^{th}$-order accumulator, the output of which is the sequence of original values. This technique may be applied to GMSK ramping, as well as QAM signal generation as in FIG. 6.

Ramping for GMSK signals when performed in the foregoing manner is "temporally compact;" i.e., ramp-up and ramp-down occur as quickly as possible consistent with spectral requirements.

The description thus far has described advantageous ramping techniques for varying-envelope signals such as EDGE and D-AMPS and constant-envelope signals such as GMSK. The present invention, in another aspect thereof, enables the generation of high-quality signals with good transient spectrum characteristics in which the modulation may switch (between GMSK and EDGE, for example) from slot to slot. This manner of operation is most readily achieved using polar modulation, enabling true multi-mode operation where mode switching is done on-the-fly, in real time.

FIG. 18 shows a polar modulator architecture like that of FIG. 12, modified for multi-mode operation. In this particular embodiment, in addition to the EDGE QAM modulator of FIG. 12, a D-AMPS QAM modulator 1822, a GMSK PAM modulator 1804, and (optionally) an AMPS interpolator 1899 are also provided, each receiving bits/symbols/words from the source 1801 in accordance with the sample clock 1805. A GMSK ramp generator 1810 like that of FIG. 15 and FIG. 16 is also provided.

Moreover, three switches are provided, controlled by the timing generator 1840. One switch SW1 is provided at the input of the R/P (rectangular-to-polar) converter 1809 and selects between the output of the EDGE QAM modulator (EDGE mode) and the output (rate-converted) of the D-AMPS QAM modulator (D-AMPS mode). Another switch SW2 is provided at the input of the AM/AM LUT (look-up table) and selects between an output of the R/P converter (EDGE or D-AMPS mode) and an output of the GMSK ramp generator (GMSK mode). Another switch SW3 is provided at the input of the AM/PM LUT and selects between an output of the RIP converter (EDGE or D-AMPS), an output of the GMSK PAM modulator (GMSK mode), and an output (rate converted) of the AMPS interpolator (AMPS mode).

Mode selection is accomplished through the system interface 1802. The mode selected will influence the configuration information 1804 received through the system interface and stored and routed to various points within the circuit, including, for example, the digital phase modulator.

An asynchronous rate converter 1897 performs the necessary rate conversions for D-AMPS and AMPS operations, as will be presently described.

In one embodiment of the multi-mode transmitter of FIG. 18, the CORDIC converter and subsequent amplitude and phase paths are designed to run at a 6.5 MHz sampling rate when the sample clock frequency is 13 MHz. This arrangement presents no difficulty for EDGE or GMSK modulations, since their symbol rates are both equal to 13/48 MHz=270.833 kHz. At the 6.5 MHz sampling rate, 24 samples per symbol are generated in the EDGE QAM modulator and the GMSK PAM modulator. However, QPSK and AMPS do not follow this rule. The QPSK symbol rate is 24.3 kHz, which does not evenly divide 6.5 MHz. Furthermore, there is no standardization of the sample rate used for the AMPS input to the DAC of a conventional baseband chip that would drive an FM modulator.

To support any sample rate that a baseband chip might use for its AMPS baseband signal, the rate converter 1897 is an asynchronous rate converter. In the presently-described embodiment, the rate converter provides output samples at a 6.5 MHz rate regardless of the input sample rate. Furthermore, in the same embodiment, the rate converter produces a clock signal (not shown) for the D-AMPS QAM modulator whereby the rate converter tells the D-AMPS QAM modulator when another input sample is required. Thus, the rate converter effectively "pulls" the data out of the modulator, as opposed to a periodic clock driving the modulator such that it "pushes" its data through subsequent stages. Likewise, in AMPS mode, the rate converter pulls the data out of the AMPS interpolator 1899, to be presently described.

For AMPS (which is a continuous transmit mode), it is assumed that a baseband processor provides the transmitter with minimally oversampled data. In a conventional transmitter, these samples would be sent to a DAC to drive a conventional FM modulator. In the present system, these samples are processed to obtain a much higher sample rate and then used to drive the digital phase modulator, operating here as a precise phase-stable FM modulator. The AMPS interpolator 1899 may be a conventional 8× interpolator, the output of which is applied to the rate converter 1897. For example, when using a 13 MHz reference clock and a 40 kHz input sample rate for AMPS samples, the 8× AMPS interpolator 1899 brings the AMPS rate up to 320 kHz, and the sample rate converter 1897 converts the sample rate to 6.5 MHz.

Figure 18A:
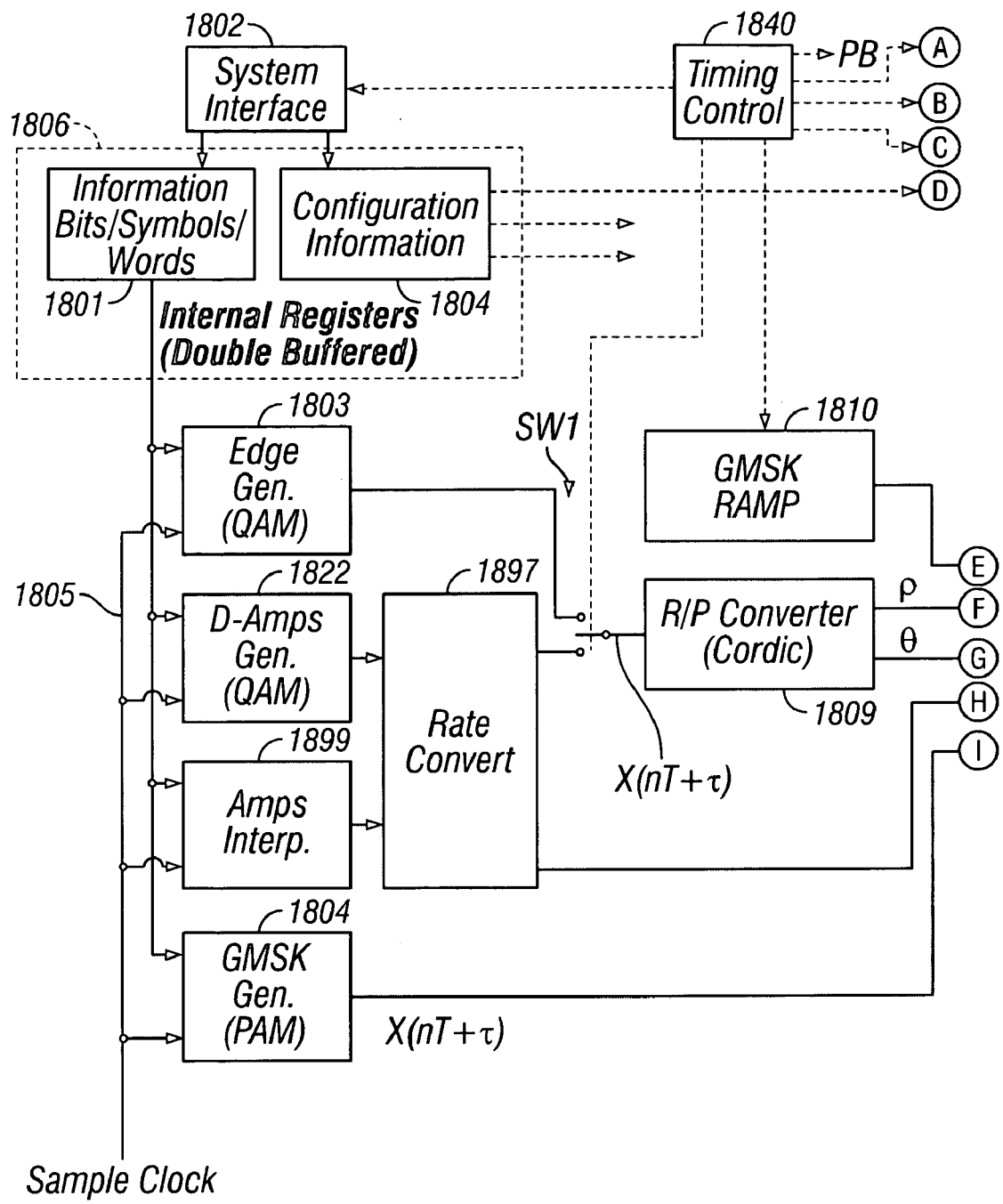
FIGS. 18A–18B is a block diagram of a multi-mode transmitter in accordance with one embodiment of the present invention.
Figure 18B:
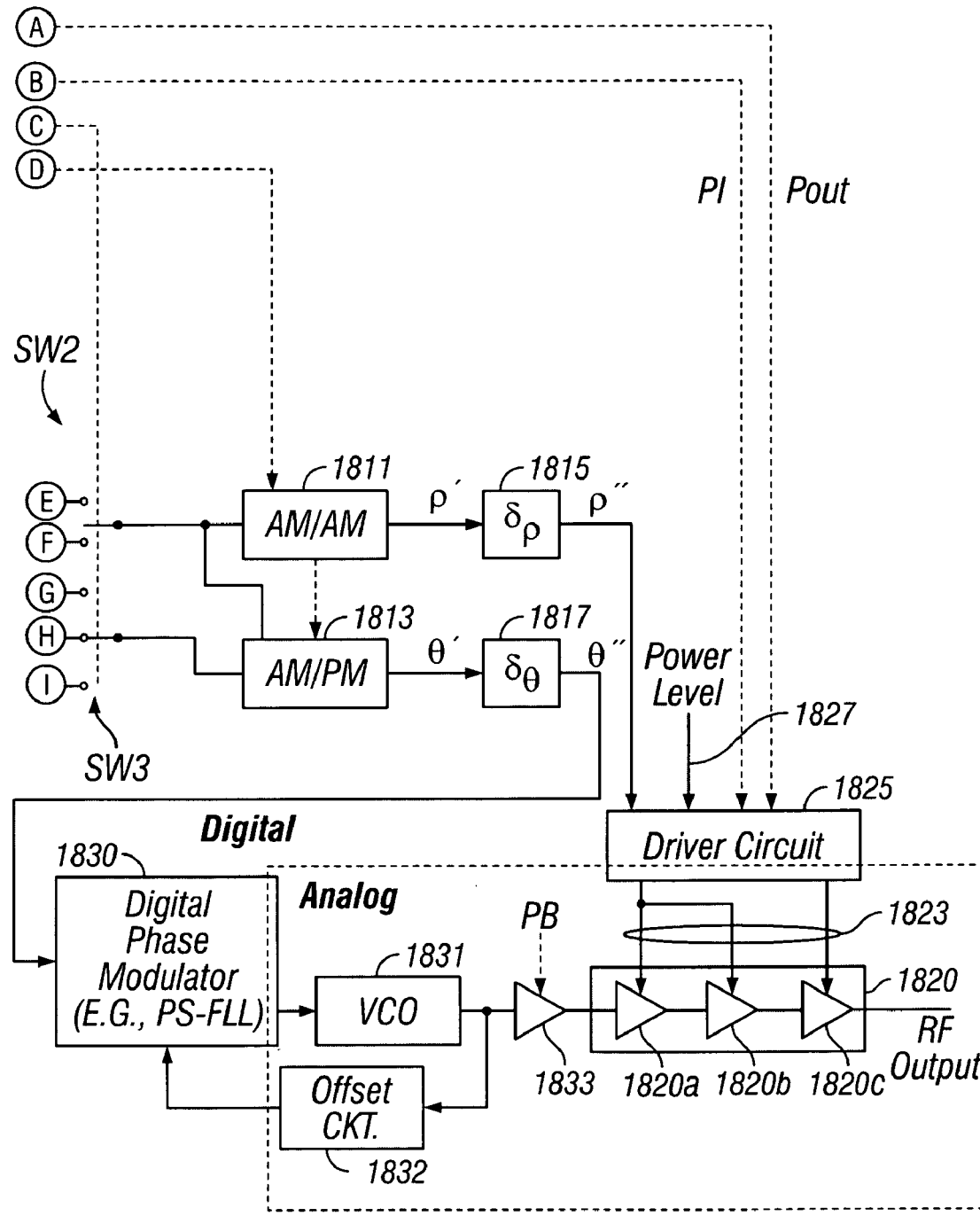

The transmitter of FIGS. 18A–18B, like that of FIG. 12, is mainly digital, the digital and analog portions being separated by a dashed line. Preferably, the digital portion is realized in the form of a single integrated circuit, for example a CMOS integrated circuit.

The characteristics of the ramping profile achieved in accordance with the present invention allow various power amplifier control signals to be abruptly switched during such low amplitude times without performance degradation. An example of the interaction between ramping and overall control of a non-linear power amplifier in a polar modulation architecture will be described with reference to FIGS. 18A–18B.

Figure 19:
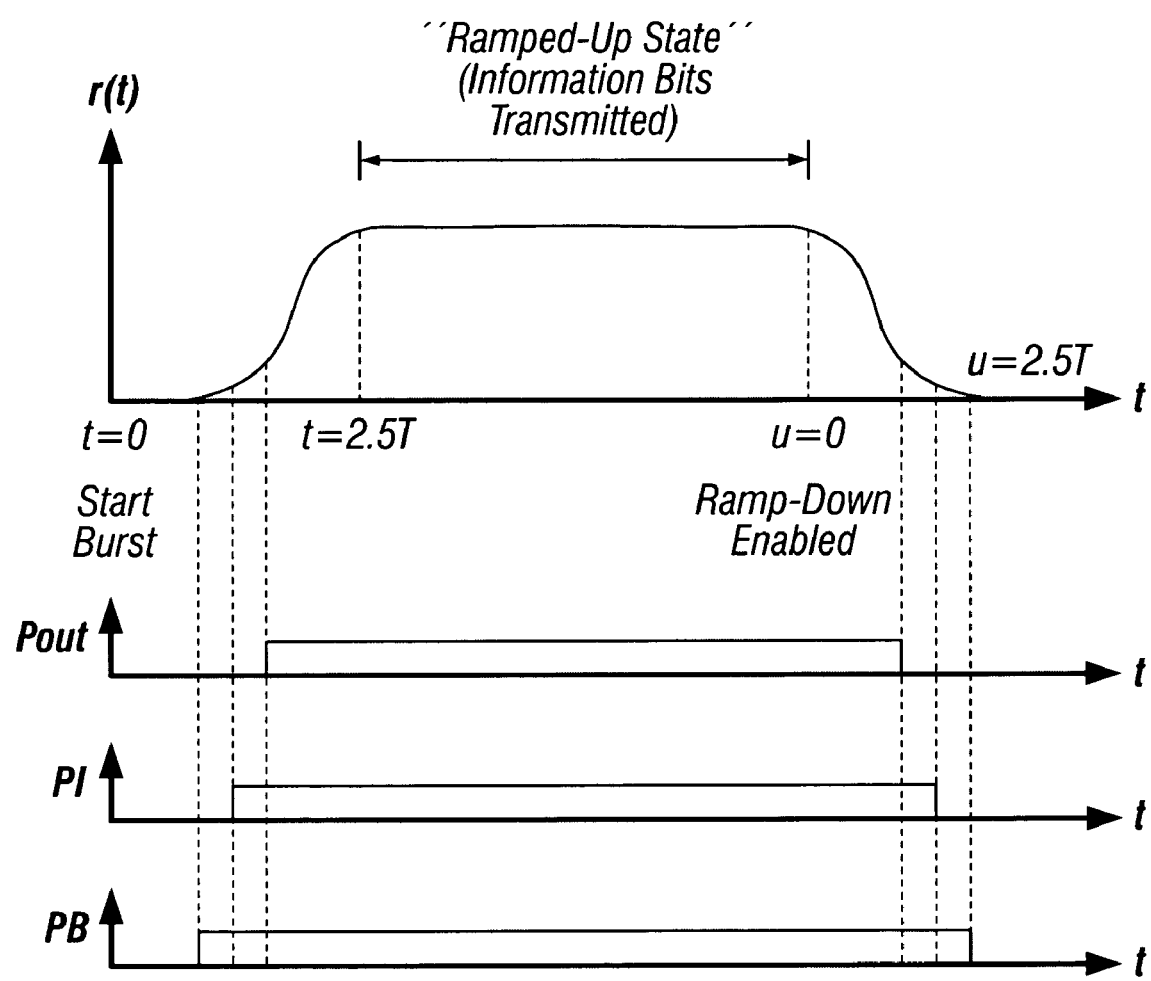
FIG. 19 is a timing diagram illustrating operation of the transmitter of FIGS. 18A–18B.

Signals PB, P1 and Pout are used to power on and power off the buffer amplifier 1833, the first and second power amplifier stages 1820a and 1820b, and the final amplifier stage 1820c, respectively. The timing of these signals relative to the rising edge ramp and falling edge ramp is important to control, in order to obtain good transient spectrum performance (little or no glitching caused by poorly-timed turn-on or turn-off effects). As previously described, the desired ramping amplitude characteristics may be obtained from the amplitude of a modulator's output (e.g., a QAM modulator as in EDGE) or from a ramp generator (e.g., as in GMSK). Additional timing logic is provided to generate PB, P1 and Pout as required. The implementation of such logic will be clear to those skilled in the art from the timing diagram of FIG. 19, showing the desired relationship between these signals and others previously described. Whereas FIG. 19 illustrates the example of GMSK, similar relationships hold between the signals PB, P1 and Pout and the timing signals of the EDGE example (e.g., the signal or counter used to control the input selector).

Referring now to FIG. 19, it may be seen that amplifiers turn on sequentially and turn off in the reverse sequence, according to their order (FIG. 18) between the frequency modulator and the RF output. To achieve the highest quality signal, the switching points for PB, P1 and Pout should be selected to correspond to low amplitude times in r(t), so that the associated switching transient is small. Optionally, the wasting of power may be avoided by minimizing the "on" time of each of the signals PB, P1 and Pout. This objective may be achieved, as illustrated in FIG. 19, by not switching PB, P1 and Pout on until r(t) is already non-zero on the ramp up, and by switching the same signals off before r(t) has reached zero on the ramp down.

Beyond the general timing relationships illustrated in FIG. 19, in any particular implementation, more exact timing relationships may be adjusted empirically to optimize transient spectral performance and temporal compactness. This process may be facilitated using "soft" or programmable timing logic, and need be done only once for a given implementation (not re-done for every unit during manufacture).

Thus there has been described a polar modulator architecture, amenable to a high level of integration, that enables ramping of both QAM (e.g., EDGE, D-AMPS) and non-QAM (e.g, GMSK) signals, and enabling glitch-free on-the-fly switching between different modulations (e.g., EDGE and GMSK). No unit-by-unit calibration is required, allowing ramp shapes to be fixed at design time. Timing control signals can also be fixed at design time, since they relate mainly to digital events or conditions. The particular ramping methods described produce narrow rising and falling edge ramps and very low transients (i.e., very good transient spectrum characteristics).

It should be noted that the foregoing techniques are general is scope across signal types. QAM signals include all signals generated using quadrature techniques and include intentional amplitude variations. QPSK signals, including CDMA, whether wideband or not, are included, as is OFDM in all its forms.

Similarly, non-QAM signals means all signals, whether genereated using quadrature techniques or not, that do not include intentional envelope variations. Besides GMSK and AMPS, such signals include the CPM (continuous phase modulation) class, whether the modulation is FM, PM or general angle modulation.

Referring to FIGS. 20A–20B, the same general architecture of FIGS. 18A–18B, previously described, may be extended to further transmission standards, for example CDMA and variants thereof such as WCDMA, cdma2000, etc. In this embodiment, a small number of additional blocks (as compared to the embodiment of FIGS. 18A–18B) are needed or desirable for purposes of supporting variants of CDMA ("xCDMA"). These additional blocks include CDMA generator, a non-linear filtering block, a separate sample rate converter, and a switch-mode power supply.

The need for a CDMA signal generator is clear. The desirability of the remaining blocks will be briefly explained.

In the case of the CDMA signal, the signal trajectory passes near the origin (i.e., the signal becomes zero or near-zero) fairly frequently. For RF amplifiers generally, accurately producing very small signals can be a problem because of leakage phenomena. In the case of polar modulators specifically, such signal trajectories result in unacceptable bandwidth expansion of the phase component. For example, in the case of a staight line signal trajectory that passes through the origin, an instantaneous phase shift of 180 degrees occurs at the instant the signal passes through the origin. Theoretically, infinite phase bandwidth is required in order to produce such a signal using a polar modulator. As a practical matter, it becomes necessary to eliminate such dramatic phase bandwidth requirements.

The process of altering the signal trajectory by some minimum required amount in order to meet phase bandwidth constraints, at the same time maintaining reasonable signal integrity, is referred to herein as non-linear filtering. In essense, an "exclusion-zone" is established about the origin. The symbol or chip stream from the signal generator is monitored, and when it is detected that the resulting signal trajectory would enter the exclusion zone, appropriate correction factors are calculated and added to the symbol or chip values to (largely) prevent such an occurrance.

Non-linear filtering is described in detail in co-pending application Ser. No. 10/037,870 entitled REDUCTION OF AVERAGE-TO-MINIMUM POWER RATIO IN COMMUNICATIONS SIGNALS, filed on even date herewith and incorporated by reference.

Because of the different symbol or chip rates of different communication standards, it may be convenient for a particular standard, such as xCDMA, to provide a separate sample rate converter running at a multiple of the symbol or chip rate. In the present instance, the output signal from the non-linear filter is provided to a separate sample rate converter. As with the other signal types previously described, rectangular-to-polar conversion then follows.

Signals of the xCDMA type typically have high peak-to-average ratios. For efficient operation, therefore, it is desirable to provide a switch-mode power converter for efficiently varying the voltage applied to the power amplifier in accordance with signal demands at any particular instant.

Having described the main additional functions of FIG. 20, the overall system of FIG. 20 will be described, in some instances reinforcing principles of operation previously touched upon.

Data and configuration information are received through a system interface bus 2001. Data is buffered in a data buffer 2003. Configuration information passes through interface logic 2005 and is stored in various registers (not shown) throughout the system.

Depending on the selected signal type, data from the data buffer is applied to a corresponding one a various signal generators, including in this example an xCDMA generator 2007a, an EDGE generator 2007b, an IS136 generator 2007c, a GMSK generator 2007d and, in the case of AMPS, instead of a genereator per se, an interpolation filter 2007e.

Sample-rate conversion will likely be required for one or more of the signal types. In the present example, rate conversion is performed for each of the signal types other than GMSK. In particular, a shared sample-rate converter 2009 is used for IS136 and AMPS, and a separate sample-rate converter 2011 is provided for xCDMA, although other arrangements are clearly possible.

Two types of signal may be distinguised, constant-envelope (corresponding to angle-modulation) and envelope-varying. The generated samples for angle-modulated signals (in this case GMSK and AMPS) are already in polar form; i.e., phase information is specified and amplitude information is fixed and therefore implied. For envelope-varying signals (e.g., xCDMA, EDGE, and IS136), the generated samples are converted to polar form using an appropriate converter such as a CORDIC converter 2013.

Although the message carried by a constant-envelope signal may be conveyed using phase only, the signal may be bursted, i.e., sent in discontinuous bursts, to achieve TDMA source the "missing" amplitude information. In the present example, therefore, a GMSK ramp generator 2015 is provided. The ramp generator may be realized in conventional fashion or as described in co-pending U.S. patent application Ser. No. 09/883,967 entitled HIGH-QUALITY POWER RAMPING IN A COMMUNICATIONS TRANSMITTER, filed on even date herewith and incorporated herein by reference.

As will be appreciated from the foregoing description, the signals Rc (whether from the CORDIC converter or the ramp generator) and θc (whether from the CORDIC converter or the GMSK generator) represent in identical fashion the desired signal regardless of signal type. Some further manipulation of these quantities is required prior to them being applied to their respective signals paths for accomplishing construction of the desired RF signal.

More particularly, in order to achieve low-distortion output performance, digital predistortion is applied to both the amplitude and phase paths. In the illustrated embodiment, predistortion is performed using an AM to AM correction block 2017 and an AM to PM correction block 2019 (which may be realized as look-up tables). Whereas AM to AM distortion is common in RF amplifiers generally, AM to PM distortion arises particularly in connection with polar modulation. The correction blocks apply to their respective signals a distortion characteristic that is the inverse of the distortion expected to be created by the power amplifier 2020 such that the distortion is counteracted.

In addition, in a polar implementation, an adjustment must be made for the difference in signal delay between the phase path and the amplitude path in order to ensure that the phase component and the amplitude component are synchronized at the power amplifier. A modulation delay adjustment block 2018 performs this function. The modulation delay adjustment block works in such a manner that the sum of the delay on one signal path through the delay adjustment block to the power amplifier is the same as the sum of the delay on the other signal path through the delay adjustment block to the power amplifier.

The signals (digital values) $R_D$ and $\theta_D$, therefore, represent the desired signal, taking into account the delay characteristics of the signal paths and the distortion characteristics of the power amplifier. These signals are applied to respective signals paths for accomplishing construction of the desired RF signal. The phase signal path will be described, followed by the amplitude signal path.

In the phase path, a structure 2030, referred to as a phase-accurate frequency-lock loop (FLL), functions in a different manner than the familar phase lock loop (PLL). In both loops, a reference signal is compared to a feedback signal derived from a controlled oscillator, such as a VCO 2031, to produce an error signal. The error signal is filtered to produce a control signal for the VCO, the control signal influencing the VCO so as to minimize the error signal or drive it to zero.

Unlike most PLLs, however, the present phase-accurate FLL is digital and operates based on frequency. Hence, the feedback signal 2033 derived from the VCO is converted from an analog signal to an accurate digital representation of the time-varying frequency of the signal, using a sigma-delta frequency-to-digital converter (FDC) 2035. Similarly, a DDS block 2037 uses the signal $\theta_D$, representing desired phase variations for purposes of angle-modulation, together with knowledge of the desired carrier frequency to produce an accurate digital representation of the time-varying frequency of the desired signal. A digital loop filter 2038 digital 2039 differences the reference signal and the digital feedback signal and filters the result to produce a control signal 2039 for the VCO.

An offset circuit 2040 provides for frequency hopping between different channel frequencies. In the illustrated embodiment, the offset circuit includes a synthesizer 2041, an offset PLL 2043, and a mixer 2045. The synthesizer receives a reference clock (e.g., 13 MHz). The same reference clock is also used by a clock generator multiplier/clock generator circuit 2050 to generate various internal clock signals.

As described more fully in the above-referenced patent, the present system uses multi-point modulation. The control path just described, including the loop filter, constitutes a "slow" modulation path. In addition, a "fast" modulation path is provided that bypasses the loop filter. Control signal produced by the two modulation paths are summed together in an adder 2061 to to produce a final control 2063 signal for the VCO.

Within the fast path, a multiplier 2065 multiplies the phase component $\theta_D$ by a scale factor 2066, the resulting quantity being converted by a DAC 2067. An output signal 2068 of the DAC is applied to the adder. A MultCal block 2069 performs a multiply/calibrate operation in cooperation with the loop filter to determine the desired scale factor.

An output signal 2032 of the VCO serves as an RF input signal to a power amplifier. The output signal of the VCO, however, carries only phase information. Amplitude variation of the RF output signal produced by the power amplifier is obtained by modulating the power supply of the power amplifier. In the case of a power amplifier having FET active devices, this technique is referred to as drain modulation. In the illustrated embodiment, the power amplifier 2020 has at least three stages, with drain modulation being applied to the drains of the second and third stages, i.e., Drain 2 (2022) and Drain 3 (2023). Drain 2 and Drain 3 are each coupled through respective pass transistors 2024 and 2025 to a supply voltage Vbat', derived from the "raw" battery voltage. In particular, a battery 2027 is coupled to a switch-mode power converter (SMPC) 2029 that efficiently reduces the voltage to a level just adequate (given the illustrated circuit configuration) to produce the desired RF output signal.

In the illustrated embodiment, the voltage level applied to Drain 3 depends on both a desired power level and on the magnitude component $R_D$. In addition, clip detection is performed to prevent saturation of the final amplifier stage, which would result in signal distortion. A multiplying DAC 2031 is therefore provided, responsive to a main input signal in the form of $R_D$ and to two other signals, a Power Level signal 2033 and Clip Detect signal 2035. The latter two signals are used together to determine a multiplier of the multiplying DAC. A DAC clock generator 2037 controls the multiplying DAC to operate at the rate of the signal $R_D$.

An output signal 2039 of the multiplying DAC is filtered using an anti-aliasing filter 2041 and is applied to a power driver 2043 and to the SMPC. The power driver 2043 drives the pass transistor to control the Drain 3 voltage. A clip detect circuit 2045 detects the onset of clipping and reduces the multiplier of the multiplying DAC to avoid clipping.

In at least some modes of operation, the voltage level applied to Drain 2 will depend in part on the output signal of the multiplying DAC, inasmuch as this signal controls the voltage Vbat'. However, to separately optimize Drain 2 and Drain 3 control, the digital Power Level signal 2031 is converted using a separate DAC 2047, an output signal of which is applied to a driver circuit 2049. The driver circuit drives the pass transistor 2024 to control the Drain 2 voltage.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of multi-mode RF communications, comprising:

during a first timeslot, transmitting a first communications signal in accordance with one of a first communications standard using constant envelope modulation and a second communications standard using varying-envelope modulation;

ramping down the first communications signal at the end of the first timeslot; and during a second adjacent timeslot, ramping up a second communications signal and transmitting the same in accordance with a different one of said first communications standard and said second communications standard;

independently setting a power level of the communications signal in the first and second timeslots;

if the first communications signal is not a constant-envelope signal having only a phase component, converting the first communications signal to obtain a phase component thereof and a magnitude component thereof; and if the second communications signal is not a constant-envelope signal having only a phase component, converting the second communications signal to obtain a phase component thereof and a magnitude component thereof.

2. The method of claim 1, comprising:

if the first communications signal is a constant-envelope having only a phase component, providing a stored-value ramp generator for the first communications signal, the ramp generator generating a ramp signal for the first communications signal; and if the second communications signal is a constant-envelope signal having only a phase component, providing a stored-value ramp generator for the second communications signal, the ramp generator generating a ramp signal for the second communications signal.

3. The method of claim 2, comprising:
providing an AM/PM correction table; and
applying the phase components of the first communications signal and the second communications signal to the AM/PM correction table to obtain first and second corrected phase components.

4. The method of claim 3, comprising:
providing an AM/AM correction table; and
applying the magnitude components of or ramp signals for the first communications signal and the second communications signal to the AM/AM correction table to obtain first and second corrected magnitude components.

5. The method of claim 4, comprising:
during the first time slot:
  driving a magnitude port of an amplification chain based on the first corrected magnitude component using a magnitude driver circuit; and
  driving a phase port of the amplification chain based on the first corrected phase component using a phase driver circuit; and during the second time slot:
    driving a magnitude port of an amplification chain based on the second corrected magnitude component using the magnitude driver circuit; and
    driving a phase port of the amplification chain based on the second corrected phase component using the phase driver circuit.

6. The method of claim 5, wherein the phase driver circuit includes a VCO.

7. The method of claim 5, wherein the phase driver circuit includes a phase-stable frequency locked loop.

8. The method of claim 4, comprising:
performing time alignment of the corrected magnitude component and the corrected phase component of the first communications signal to produce a time-aligned, corrected magnitude component and a time-aligned, corrected phase component of the first communications signal; and
performing time alignment of the corrected magnitude component and the corrected phase component of the second communications signal to produce a time-aligned, corrected magnitude component and a time-aligned, corrected phase component of the second communications signal.

9. The method of claim 1, wherein the constant-envelope modulation is GMSK, and a GMSK signal is formed.

10. The method of claim 9, wherein a ramp shape for the GMSK signal is determined in accordance with a pulse shape used to generate a communications signal in accordance with the EDGE standard.

11. The method of claim 9, wherein the varying-envelope modulation is QAM, the second communications standard is EDGE, and an EDGE signal is formed.

12. The method of claim 11, wherein a ramp shape for the EDGE signal is obtained by:
adding a predetermined sequence of symbols to a sequence of information symbols to be communicated to form an augmented sequence of symbols; and
performing modulation of the augmented sequence of symbols to produce an envelope signal that exhibits a desired ramp profile.

13. A method of multi-mode RF communications, comprising:
during a first timeslot, transmitting a first communications signal in accordance with one of a first communications standard using constant envelope modulation and a second communications standard using varying-envelope modulation;
ramping down the first communications signal at the end of the first timeslot; and
during a second adjacent timeslot, ramping up a second communications signal and transmitting the same in accordance with a different one of said first communications standard and said second communications standard;
adding a predetermined sequence of symbols to a sequence of information symbols to be communicated to form an augmented sequence of symbols; and
performing modulation of the augmented sequence of symbols to produce an envelope signal that exhibits a desired ramp profile;
wherein the varying-envelope modulation is QAM, and the second communications standard is EDGE, and an EDGE signal is formed.

14. An apparatus for multi-mode RF communications, comprising:
means for, during a first timeslot, transmitting a first communications signal in accordance with one of a first communications standard using constant-envelope modulation and a second communications standard using varying-envelope modulation;
means for ramping down the first communications signal at the end of the first timeslot;
means for, during a next adjacent timeslot, ramping up a second communications signal and transmitting the same in accordance with a different one of said first communications standard and said second communications standard;
means for independently setting a power level of the communications signal in the first and second timeslots; and
means for converting a communications signal that is not a constant-envelope signal having only a phase component to obtain a phase component thereof and a magnitude component thereof.

15. The apparatus of claim 14, comprising a stored-value ramp generator for generating a ramp signal for one of the first communications signal and the second communications signal.

16. The apparatus of claim 15, comprising:
an AM/PM correction table, the phase components of the first communications signal and the second communications signal being applied to the AM/PM correction table to obtain first and second corrected phase components.

17. The apparatus of claim 16, comprising:
an AM/PM correction table, the magnitude components of or ramp signals for the first communications signal and the second communications signal being applied to the AM/AM correction table to obtain first and second corrected magnitude components.

18. The apparatus of claim 17, comprising:
an amplification chain having a magnitude port and a phase port;

a magnitude driver circuit responsive to the first and second corrected magnitude components for driving the magnitude port of the amplification chain; and a phase driver circuit responsive to the first and second corrected phase components for driving the phase port of the amplification chain.

19. The apparatus of claim 18, wherein the phase driver circuit includes a VCO.

20. The apparatus of claim 18, wherein the phase driver circuit includes a phase-stable frequency locked loop.

21. The apparatus of claim 17, comprising:

means for performing time alignment of the corrected magnitude components and the corrected phase components of the communications signals to produce for each communications signal a time-aligned, corrected magnitude component and a time-aligned, corrected phase component.

* * * * *